United States Patent [19]
Kaneko et al.

[11] 4,433,258
[45] Feb. 21, 1984

[54] COMPLEMENTARY SCHOTTKY TRANSISTOR LOGIC CIRCUIT

[75] Inventors: Kenji Kaneko, Hachioji; Takahiro Okabe, Tokyo; Minoru Nagata, Kodaira; Yutaka Okada, Tokyo, all of Japan

[73] Assignee: Hitachi, Ltd., Tokyo, Japan

[21] Appl. No.: 245,163

[22] Filed: Mar. 18, 1981

[30] Foreign Application Priority Data

Mar. 18, 1980 [JP] Japan .................................. 55-34380

[51] Int. Cl.³ .................. H03K 19/092; H03K 19/088
[52] U.S. Cl. ...................................... 307/456; 307/454
[58] Field of Search ............................. 307/454–459, 307/477; 357/92

[56] References Cited

U.S. PATENT DOCUMENTS

| | | | |
|---|---|---|---|
| 3,617,778 | 11/1971 | Korom | 307/456 X |
| 3,769,524 | 10/1973 | Mathews | 307/458 X |
| 4,131,806 | 12/1978 | Kirschner | 307/459 |
| 4,140,920 | 2/1979 | Dao et al. | 307/477 X |
| 4,165,470 | 8/1979 | Fulkerson | 307/454 |

*Primary Examiner*—Larry N. Anagnos
*Assistant Examiner*—David R. Hudspeth
*Attorney, Agent, or Firm*—Antonelli, Terry & Wands

[57] ABSTRACT

A logic circuit is provided which includes a plurality of basic circuits each of which has a pnp (or npn) transistor as a constant current load and at least one npn (or pnp) transistor each as a driver with a clamping Schottky diode. The base of the driver transistor is used as an input terminal and the collector thereof is used as an output terminal, for each basic circuit and the output terminal of the preceding stage basic circuit is coupled directly to the input terminal of the subsequent stage basic circuit. In order to prevent current hogging the load current supplied from the preceding stage constant current load transistor is set to operate the subsequent stage driver transistor in a saturation made when the subsequent stage driver transistor is in the ON state.

12 Claims, 9 Drawing Figures

COMPLEMENTARY SCHOTTKY TRANSISTOR LOGIC CIRCUIT

BACKGROUND OF THE INVENTION

The invention relates to a logic circuit which has a simple circuit configuration and operates at a high speed. More specifically, the present invention relates to a Complementary Schottky Transistor Logic Circuit (which will be hereinafter referred to as the CSTL circuit).

The basic concept of the CSTL circuit employed in the present invention has been disclosed in in Japanese Utility Model Application Laid-Open No. 169454/79 entitled "Logic Circuit", laid open on Nov. 30, 1979; and the present invention concerns interconnection of such CSTL circuits and setting of load conditions associated therewith.

As logic circuits using bipolar transistors, in general, TTL, STTL and ECL circuits have become well known. Although these circuits operate at higher speeds, they consume large power and require a large circuit area. An $I^2L$ circuit which has been proposed recently, operates at a lower speed though it needs a substantially smaller circuit area.

On the other hand, there has been suggested a $C^3L$ logic circuit which is intended to bridge the gap between the TTL circuits and the $I^2L$ with respect to the performance and the circuit area (ISSCC '75 Session 14.4 A New Approach to Bipolar LSI; $C^3L$).

The basic circuit configuration of the $C^3L$ circuit is shown in FIG. 1A and has the following features.

(1) The $C^3L$ circuit is similar to the $I^2L$ circuit and has a pnp transistor P1 at its base input side and a driving transistor (npn transistor) N1. Because the driving transistor N1 is in the downward- or forward-operation mode, it operates at a high speed.

(2) The driver transistor N1 has two sorts of Schottky diodes D1 and D2 (and/or D2' and/or D2'') for clamp and output, respectively.

(3) The $C^3L$ circuit has one input IN and a plurality of outputs OUT1 to OUT3.

In FIG. 1A, a supply voltage is denoted by $V_{EE}$ and a bias voltage for a base of the load transistor P1 is represented by $V_{BB}$.

FIG. 1B shows a logic circuit which comprises three basic $C^3L$ circuits of FIG. 1A and includes pnp transistors P11, P12, P13, npn transistors N11, N12, N13, and Schottky diodes D21, D22, D23 for output. A clamping Schottky diode is provided in each npn transistor but is omitted in FIG. 1B. More specifically, each of the transistors N11, N12 and N13 in FIG. 1B consists of such an npn transistor N1 and a clamping Schottky diode D1 as shown in FIG. 1A, and is represented by a symbol " ".

The major defect of the $C^3L$ logic circuit is that the circuit requires two types of Schottky diodes. In the operation of the $C^3L$ circuit, logic swing $\Delta V$ is expressed in terms of $V_{F1}$ and $V_{F2}$ as follows.

$$\Delta V = V_{F1} - V_{F2}$$

where, $V_{F1}$ represents the forward voltage of the diode D1 and $V_{F2}$ represents the forward voltage of the diode D2. In the above equation, $V_{F1}$ must be always greater than $V_{F2}$.

In order to make sure to always satisfy the above relationship and condition, the two types of Schottky diodes must be fabricated with different metals to each other. In the case of the $C^3L$ circuit disclosed in 1975, the diodes D1 is formed with PtSi and the diode D2 is with Ti.

In fabrication of integrated circuits of such logic circuits, the necessity to use two types of interconnection metals will involve many undesirable problems. More specifically, a Schottky diode basically consists of a metal in contact with silicon (Si) and its interconnection is established by making an electrode hole usually called a contact hole, evaporating the metal and then providing patterning. In the case that two types of metals are required, as for example, in the $C^3L$ circuit fabrication; first, the operations of contact hole making, metal evaporation and patterning must be provided with respect to one of the two types of diodes, and thereafter the similar operations must be provided for the other diodes, of course, by use of different metal from the former diode. This means that this $C^3L$ circuit fabrication requires three additional steps, i.e. a total of three steps of contact making, evaporation and patterning, when compared to other logic circuit fabrication in which one type of metal is necessary. In addition, the $C^3L$ circuit fabrication requires two additional masks for the contact hole and patterning. Especially, in the practical $C^3L$ circuit fabrication, four types of metals of PtSi, Ti, Pt and Al (or Au) are used, which results in many complicated steps.

Such complicated production steps and the increased number of masks will undesirably contribute to the increased cost and reduced yield in fabrication of the integrated circuit.

SUMMARY OF THE INVENTION

An object of the present invention is to provide a logic circuit which has a simple circuit configuration and operates at a high speed.

The specific object of the present invention is to provide a CSTL circuit. More particularly, the present invention provides a logic circuit which comprises a CSTL circuit and is designed to prevent current hogging.

The above objects can be accomplished, in accordance with the present invention, by providing a CSTL circuit which comprises an inverter circuit or a NOR circuit as a basic gate, and by directly coupling the input to the output of the gates. In the logic circuit of the present invention, the load current of the load transistor is set so that the collector current of the load transistor in the preceding stage gate causes the degree of saturation of each driver transistor in the subsequent stage gate to be not less than 1.

DESCRIPTION OF THE PREFERRED EMBODIMENTS

Figure 2A:
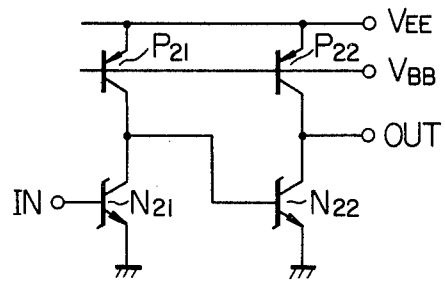
FIG. 2A shows a two-stage inverter circuit which is based on a CSTL circuit in accordance with the present invention.
Figure 2B:
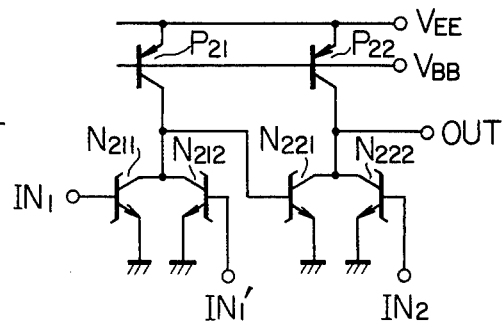
FIG. 2B shows a two-stage NOR circuit which is based on a CSTL circuit in accordance with the present invention.

Turning now to the drawings, there are shown in FIGS. 2A and 2B two basic configurations of a CSTL circuit of the present invention, in which FIG. 2A is a two stage inverter circuit and FIG. 2B is a two stage NOR circuit. The feature of illustrated circuits is that pnp transistors P21 and P22 of constant current sources are used as loads and npn transistors N21, N22, N211, N212, N221 and N222 with the associated clamp Schottky diodes are used as driver transistors. In FIGS. 2A and 2B, $V_{EE}$ is the supply voltage and $V_{BB}$ is a base bias voltage of each pnp transistor.

When compared with the C³L circuit, the CSTL circuit of the present invention is greatly different in the following points.

(1) The present invention requires only one type of Schottky diodes. In other words, the electrodes can be formed with one type of metal. This means that the reversal of the defects previously described in connection with the C³L circuit can apply for the present invention, that is, as advantages.

(2) A load is provided at the collector side of the driver transistor.

Figure 1A:
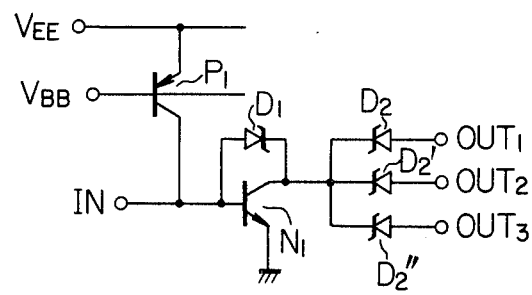
FIG. 1A shows a basic gate configuration of a prior art $C^3L$ circuit.
Figure 1B:
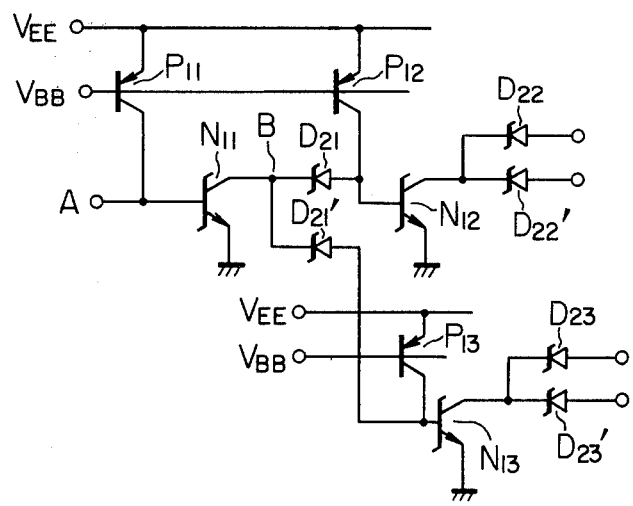
FIG. 1B shows a prior art $C^3L$ circuit.

(3) The collector of the driver transistor is direct coupled to the input of the subsequent stage gate, unlike the C³L circuit of FIG. 1B in which a diode is inserted.

(4) According to the present invention, a load is provided at the associated collector side and the output of the preceding stage is coupled directly to the input of the subsequent stage, which results in a higher operational speed. With the C³L circuit of FIG. 1B, when an input A goes to a low level, output point B is charged through the subsequent load stage gate and the related output diode, which results in the delayed rising timing of the output signal.

In this way, the present invention has advantages of a much simplified production process and higher operational speed by virtue of the major difference of the present invention from the conventional C³L circuit regarding the circuit configuration and gate-to-gate interconnection. It will be clear that since the present invention requires only one type of Schottky diode, the invention is also different from the C³L circuit in the element structure.

Figure 5:
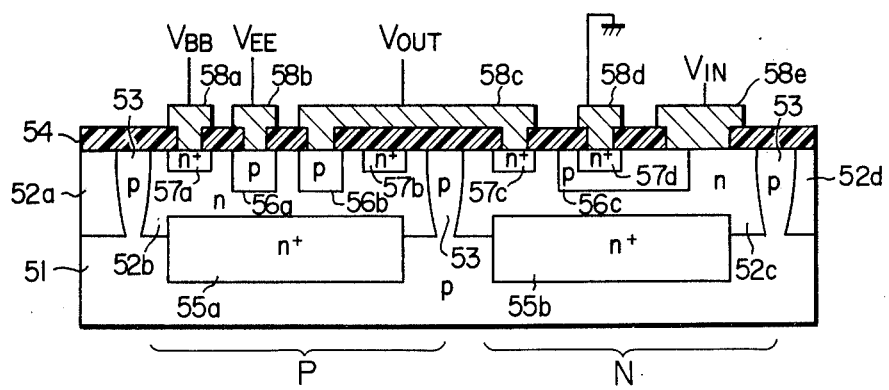
FIG. 5 shows the structure, in cross section, of the CSTL circuit in the integrated circuit configuration.

FIG. 5 shows a cross sectional structure of a logic circuit formed on an IC chip which includes a Si substrate 51 of p-type conductivity, Si epitaxial grown layer regions 52a, 52b, 52c, 52d of n-type conductivity, p-type isolation regions 53, a SiO₂ film 54, n+-type buried layers 55a, 55b, p-type layers 56a, 56b, 56c, n+-type layers 57a, 57b, 57c, 57d, and metallic electrodes 58a, 58b, 58c, 58d, 58e. The features of the illustrated logic circuit according to the present invention are as follows.

(1) Each pnp transistor as a load can be constituted, for example, by an ordinary lateral transistor generally designated as reference P in FIG. 5. Further, since the pnp transistors in the entire logic circuit can all have a common base 52b, a common isolated region can contain all the pnp transistors in the entire logic circuit, allowing a smaller area for the IC logic circuit.

(2) As the Schottky transistor, a usual forward-operated or downward-operated transistor can be used such as a transistor generally represented by reference N in FIG. 5. The Schottky transistor includes the related Schottky diode which is formed between the metallic electrode 58e, for example, made of Al and the isolated epitaxial-grown region 52c (a collector) which does not have a high impurity concentration. In general, the isolated region 52c of Schottky transistors must be separated from one another for each gate. However, in the case of the NOR circuit type having a common collector as in FIG. 2B, even if the number of gate inputs increases, such Schottky transistors can be included in a common isolated region as long as they are in the same gate. With the logic circuit of the present invention, as has been described above, a circuit having a smaller area can be realized by reducing the number of isolated regions of transistors, in addition to its simplified circuit configuration.

Figure 3:
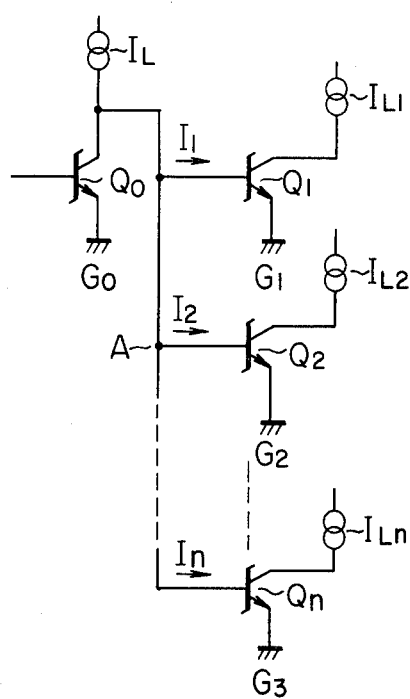
FIG. 3 shows, as an example, how the fan out of the CSTL circuit of the present invention is available.

FIG. 3 shows, as an example, how the fan out of the CSTL circuit of the present invention is available.

As previously described with reference to FIGS. 2A and 2B, the logic circuit of the present invention has its output coupled directly to the input of the subsequent stage. This interconnection is the same as that of a prior art logic circuit of the type referred to as DCTL (Direct Coupled Transistor Logic). Therefore, in FIG. 3, the preceding stage gate $G_0$ is connected in parallel with the subsequent stage gates $G_1$ to $G_n$ for parallel driving.

In FIG. 3, $I_L$, $I_{L1}$–$I_{Ln}$ represent the currents of the equivalent constant current sources to which the pnp transistors as constant-current loads in FIG. 2A and FIG. 2B are converted.

So far, the DCTL circuit has been seldom used in the form of an integrated circuit, because the DCTL circuit in an IC form involves current hogging, causing the malfunction of the circuit. Explanation will be made about how to eliminate this current hogging phenomenon in the embodiments.

In FIG. 3, the current hogging can be prevented by making identical the dimensions and shape of the base, emitter and Schottky junction of each npn transistor $Q_0$, $Q_1 \ldots Q_n$ with the respective clamping Schottky diode in each gate, and by adjusting the load current of each gate.

The load current of each gate is determined in the following manner. If the gate $G_0$ has a low level at its input in FIG. 3, the load current $I_L$ is supplied to the respective inputs of the gates $G_1$ to $G_n$. In this case, the respective input currents of the gates $G_1$ to $G_n$ must be large enough to turn the associated gates on.

The load current $I_L$ is written as follows.

$$I_L = \sum_{k=1}^{n} I_K \tag{1}$$

where, $I_1$ to $I_n$ are the respective input currents of the gates $G_1$ to $G_n$. On the other hand, when a potential $V_B$ appears at a point A in FIG. 3, the driver transistors $Q_1$ to $Q_n$ in the gates will satisfy the following equation.

$$I_K + I_{LK} = f(V_B) \tag{2}$$

Where, $f(V_B)$ is the emitter current of the particular transistor $Q_1$–$Q_n$, and $I_{L1}$–$I_{Ln}$ are the respective collector currents of the transistors $Q_1$ to $Q_n$. $f(V_B)$ is common to each driver transistor $Q_1$–$Q_n$, that is, equation (2) is established because the bases of all the transistors $Q_1$ to $Q_n$ are connected in the parallel relationship.

From equations (1) and (2), the input current $I_k$ of the particular gate $G_k$ is found as $$I_k = \frac{I_L + \sum_{k=1}^{n} I_{LK}}{n} - I_{LK} \tag{3}$$

It will be seen from equation (3) that since the input current $I_k$ of the gate $G_k$ is also the base current of the driver transistor $Q_k$, the degree of saturation of the transistor $Q_k$ can be helpful to see if the base current of the gate $G_k$ is large enough to turn the gate $G_k$ on. The degree $D_k$ of saturation of the transistor $Q_k$ is expressed as $$D_k = \frac{I_{Ck}}{I_{Lk}} \tag{4}$$

Where, $I_{Ck}$ represents the value of current which the collector is capable of absorbing and $I_{Lk}$ is the load current. Therefore, equation (4) can be re-written as follows.

$$D_k = \frac{\beta I_k}{I_{Lk}} = \frac{\beta}{I_{Lk}} \left( \frac{I_L + \sum_{k=1}^{n} I_{Lk}}{n} - I_{Lk} \right) \tag{5}$$

Where $\beta$ is the current amplification factor of the transistor $G_k$. As a result, the load currents $I_L$ and $I_{Lk}$ are determined so that the degree of saturation $D_k$ of each gate is not less than 1 (when the allowance is considered, $D_k$ is desirably not less than 4.).

For example, if the gate $G_0$ drives the three gates $G_1$ to $G_3$, $\beta$ is not less than 100, and the load currents $I_{L1}$, $I_{L2}$ and $I_{L3}$ of the gates $G_1$ to $G_3$ are respectively $2I_0$, $5I_0$ and $5I_0$, in FIG. 3, then the load current $I_L$ necessary for the gate $G_0$ must be greaer than $3I_0$.

In this way, with the circuit arrangement of the present invention, if a large fan out is required, current hogging can be prevented by varying the load current of each gate. In accordance with the present invention, a pnp transistor is used as a constant current load so that the load currents of gates can be easily changed to different desired levels.

Figure 4A:
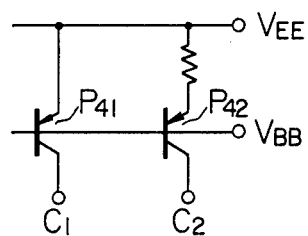
FIGS. 4A, 4B and 4C show different embodiments to provide different desired load currents in the CSTL circuit.
Figure 4B:
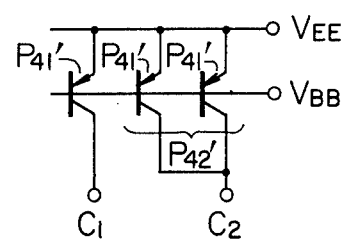
Figure 4C:
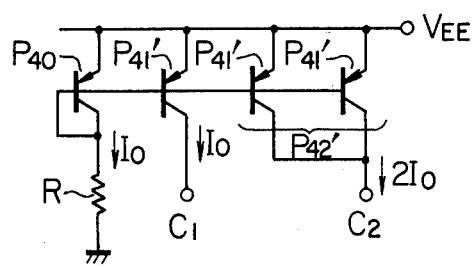

FIGS. 4A, 4B and 4C are different embodiments to provide different desired load currents in accordance with the present invention.

In FIG. 4A, a resistor is inserted in the emitter circuit of a pnp transistor P42 to provide different currents for collectors $C_1$ and $C_2$ of pnp transistors P41 and P42.

In FIG. 4B, the distance between the emitter and the collector, i.e., the base width of a lateral pnp transistor P42' is varied to provide different currents for the collectors $C_1$ and $C_2$ of the transistors P41' and P42', which is a measure usually employed in a lateral pnp transistor structure.

If the opposing emitter-to-collector length or distance is twice that of the transistor P41' (that is, the transistor P42' substantially consists of the two transistors P41'), the current through the collector $C_2$ is twice that through the collector $C_1$.

In FIG. 4C, finally, a current mirror pnp transistor P40 is added in FIG. 4B to provide different load currents for the collectors $C_1$ and $C_2$. In this case, when the opposing emitter-to-collector length of the transistor P41' is identical with the transistor P40 and that of the transistor P42' is twice that of the transistor P40, the current through the collector $C_1$ is $I_0$ (which is the same as the collector current of the transistor P40) and that through the collector $C_2$ is $2I_0$.

In this way, different desired collector currents can be easily obtained.

With the arrangement as has been described above, the present invention can provide a logic circuit which operates at a higher speed and with a higher stabilization and requires a smaller circuit area.

In brief, with the arrangement of the logic circuit as has been disclosed, the present invention has the following features.

(1) The output (the collector of the npn transistor) of the preceding stage gate is coupled directly to the input (the base of the npn transistor) of the subsequent stage gate.

(2) When a large fan out is required, various different load currents can be provided to avoid current hogging. The load currents are set so that the degree of saturation of each driver transistor in gates is not less than 1.

The logic circuit of such a configuration as described above in accordance with the present invention exhibits a minimum delay time of less than 2 nanoseconds and a maximum operating frequency of 70 MHz. These performances can be further enhanced by improving the production conditions.

What is claimed is:

1. A logic circuit comprising a plurality of basic circuits each including at least one single-collector driver transistor provided with a clamping Schottky diode, the emitter of said driver transistor being grounded, the base of said driver transistor being used as an input terminal and the collector thereof being used as an output terminal for said basic circuit, each of said basic circuits further including a constant current load transistor coupled to said output terminal of each said basic circuit, wherein the output terminal of a preceding stage basic circuit is coupled directly to the input terminal of the subsequent stage basic circuit, said logic circuit further comprising means for adjusting the amplitude of said constant current provided by each of said constant current load transistors to operate the driver transistor of the subsequent stage, with said clamping Schottky diode forward biased, in a shallow saturation mode when said subsequent stage driver transistor is in an ON state.

2. A logic circuit as defined in claim 1, wherein the emitter of said constant current load transistor is connected to a power supply and the base thereof is connected to a bias supply and the collector thereof is connected to the collector of said driver transistor.

3. A logic circuit as defined in claim 1, wherein said constant current load transistor is a lateral transistor.

4. A logic circuit as defined in claim 3, wherein the emitter-to-collector length of each constant current load transistor in said preceding and subsequent stages is set so that the collector current of said constant current load transistor causes the degree of saturation of each of the subsequent stage driver transistor to be not less than 1.

5. A logic circuit as defined in claim 1 or 2, wherein said basic circuit comprises an inverter circuit constituted by a driver transistor.

6. A logic circuit as defined in claim 1 or 2, wherein said basic circuit comprises a NOR circuit including a plurality of driver transistors, and the collectors of said driver transistors are connected together and the base of each driver transistor forms one of multiple input terminals.

7. A logic circuit as defined in claim 1, wherein said load transistor is of a pnp type and said driver transistor is of an npn type.

8. A logic circuit as defined in claim 1, wherein said load transistor is of an npn type and said driver transistor is of a pnp type.

9. A logic circuit as defined in claim 1, wherein said adjusting means is set so that the degree of saturation of the subsequent stage driver transistor is not less than 1.

10. A logic circuit comprising a plurality of basic circuits each including at least one single collector driver transistor provided with a clamping Schottky diode, the emitter of said driver transistor being grounded, the base of said driver transistor being used as an input terminal and the collector thereof being used as an output terminal for said basic circuit, each of said basic circuits further including a constant current load transistor coupled to said output terminal of each said basic circuit, wherein the output terminal of a preceding stage basic circuit is coupled directly to the input terminal of a plurality of subsequent stage basic circuits, said logic circuit further comprising means for adjusting the amplitude of said constant current provided by each of said constant current load transistors to operate each of the driver transistors of the subsequent stages, with their clamping Schottky diodes forward biased, in a shallow saturation mode when said subsequent stage driver transistors are in an ON state.

11. A logic circuit comprising a plurality of directly coupled logic stages each including at least one circuit unit, each said circuit unit having a load transistor serving as a constant current load and at least one single collector driver transistor provided with a clamping Schottky diode, the emitter of said driver transistor being grounded and the base and the collector of said driver transistor being used as an input terminal and an output terminal for their associated circuit unit, respectively, wherein at least one of said logic stages includes a plurality of said circuit units coupled to be driven by a preceding logic stage, the logic circuit further comprising means for adjusting the amplitudes of the constant currents provided by the constant current load transistors of said at least one logic stage and said preceding logic stage such that the driver transistor in each of the circuit units of said at least one logic stage is operated, with its clamping Schottky diode forward biased, in a shallow saturation mode when it is in an ON state.

12. A logic circuit according to claim 11, in which said adjustment of the amplitudes of the constant currents provided by the constant current load transistors is such that the following condition is met for each of the circuit units of said one logic stage and said preceding logic stage:

$$\frac{\beta}{I_{LK}}\left(\frac{I_L + \sum_{K=1}^{n} I_{LK}}{n} - I_{LK}\right) \geq 1$$

where
- $\beta$: the current amplification factor of the driver transistor in each individual circuit unit of said one logic sgage;
- $I_{LK}$: the constant load current provided by the load transistor in each individual circuit unit of said one logic stage;
- $I_L$: the constant load current provided by the load transistor of the circuit unit of said preceding logic stage; and
- n: the number of the driver transistors of the circuit units in said one logic stage.

* * * * *